United States Patent
Arnold et al.

(10) Patent No.: US 11,322,948 B2
(45) Date of Patent: May 3, 2022

(54) BATTERY-POWERED HOUSEHOLD APPLIANCE AND BATTERY CHARGING STATION

(71) Applicant: Vorwerk & Co. Interholding GmbH, Wuppertal (DE)

(72) Inventors: Hans-Peter Arnold, Kierspe (DE); Thomas Büning, Bochum (DE); Benjamin Fleczok, Essen (DE); Robert Frielinghaus, Bochum (DE); Martin Helmich, Duisburg (DE); Lorenz Hillen, Wuppertal (DE); Christian Holz, Dortmund (DE); Gerhard Isenberg, Cologne (DE); Andrej Mosebach, Bochum (DE); Roman Ortmann, Duisburg (DE); Kevin Schmitz, Düsseldorf (DE); Fabian Vitz, Wuppertal (DE); Niklas van Teeffelen, Velbert (DE); Georg Hackert, Bochum (DE)

(73) Assignee: Vorwerk & Co. Interholding GmbH

( * ) Notice: Subject to any disclaimer, the term of this patent is extended or adjusted under 35 U.S.C. 154(b) by 51 days.

(21) Appl. No.: 16/773,461

(22) Filed: Jan. 27, 2020

(65) Prior Publication Data
US 2020/0251914 A1  Aug. 6, 2020

(30) Foreign Application Priority Data
Jan. 31, 2019  (EP) .................................... 19154796

(51) Int. Cl.
*H02J 7/00* (2006.01)
*G01R 31/382* (2019.01)
*A47L 9/28* (2006.01)

(52) U.S. Cl.
CPC .......... *H02J 7/0014* (2013.01); *A47L 9/2884* (2013.01); *G01R 31/382* (2019.01); *H02J 7/00036* (2020.01)

(58) Field of Classification Search
CPC ...... H02J 7/007; H02J 7/0014; H02J 7/00034; H02J 7/0044; H02J 7/00036; H02J 7/0013;
(Continued)

(56) References Cited

U.S. PATENT DOCUMENTS 9,820,433 B2 * 11/2017 Borinato .............. A01D 34/008
9,960,637 B2 *  5/2018 Sanders .................. H02J 15/00
(Continued)

FOREIGN PATENT DOCUMENTS

CA        2383445 A1    10/2003
JP   2009116634 A  *  5/2009
(Continued)

*Primary Examiner* — Helen Rossoshek
(74) *Attorney, Agent, or Firm* — Barnes & Thornburg LLP (57) ABSTRACT

The present disclosure relates to a system with a household appliance, a charging station and a plurality of battery units. A control of the system is configured so that a battery unit connected to the charging station can be charged in dependence on a discharge of a battery unit which is connected to the household appliance for operating the household appliance to perform a use operation. The present disclosure further concerns a household appliance and a charging station. It is thereby made possible to perform particularly long use operations with only two battery units or at least a reduced number of battery units without an interruption for charging a battery, and at the same time to achieve the longest possible service life of the battery units.

18 Claims, 2 Drawing Sheets

(58) Field of Classification Search
CPC .... A47L 5/24; A47L 2201/022; A47L 9/2852; A47L 9/2873; A47L 9/2836; A47L 9/2884; G01R 31/382; Y02T 90/12

See application file for complete search history.

(56) References Cited

U.S. PATENT DOCUMENTS

| | | | | |
|---|---|---|---|---|
| 10,813,513 | B2* | 10/2020 | Erkek | G05D 1/0272 |
| 2008/0169910 | A1* | 7/2008 | Greene | H02J 50/70 |
| | | | | 340/10.34 |
| 2008/0174268 | A1* | 7/2008 | Koo | G05D 1/0234 |
| | | | | 320/109 |
| 2009/0015195 | A1* | 1/2009 | Loth-Krausser | H02J 7/0013 |
| | | | | 320/107 |
| 2014/0191568 | A1* | 7/2014 | Partovi | H02J 50/90 |
| | | | | 307/9.1 |
| 2016/0000289 | A1* | 1/2016 | Senoo | A47L 9/2852 |
| | | | | 15/319 |
| 2017/0368684 | A1* | 12/2017 | Zevenbergen | B25J 19/005 |
| 2018/0260887 | A1* | 9/2018 | Takatsuka | H02J 7/04 |
| 2018/0275668 | A1* | 9/2018 | Diehr | G05D 1/0225 |
| 2019/0365170 | A1* | 12/2019 | Mowisch | G08B 21/0461 |
| 2020/0077851 | A1* | 3/2020 | Kashihara | A47L 9/00 |
| 2020/0100637 | A1* | 4/2020 | Tanaka | A47L 9/2884 |
| 2020/0100640 | A1* | 4/2020 | Marutani | A47L 9/2852 |
| 2020/0315419 | A1* | 10/2020 | Sato | A47L 9/2873 |
| 2020/0316786 | A1* | 10/2020 | Galluzzo | B25J 9/1679 |
| 2021/0038041 | A1* | 2/2021 | Pruiett | A47L 9/2894 |
| 2021/0052124 | A1* | 2/2021 | Jun | A47L 9/0686 |

FOREIGN PATENT DOCUMENTS

| | | | | | |
|---|---|---|---|---|---|
| JP | | 6152934 | B2 * | 6/2017 | |
| JP | | 6667648 | B2 * | 3/2020 | ........... A47L 9/2884 |
| WO | 2013024484 | A1 | | 2/2013 | |

* cited by examiner

BATTERY-POWERED HOUSEHOLD APPLIANCE AND BATTERY CHARGING STATION

PRIORITY CLAIM

This application claims priority to European Patent Application No. 19154796.7, filed Jan. 31, 2019, which application is hereby incorporated in its entirety herein.

FIELD OF THE DISCLOSURE

The present disclosure relates to a system with a household appliance, a charging station and several battery units as well as a household appliance and a charging unit.

BACKGROUND

Household appliances, such as a battery-driven vacuum cleaner, that are powered by a rechargeable battery can have the disadvantage that their use is limited by the battery life. For this reason, a replacement battery is often provided in order to be able to continue the use operation without major interruption. When the battery in use is empty, the empty battery can be immediately replaced by the fully charged replacement battery, which has been charged in a charging station and kept in a charged state. The first inserted and now discharged battery is in turn connected to the charging station for charging. During longer use operations, such as e.g. vacuuming a larger apartment, the replacement battery may run out before the use process is complete. In this case, the battery that was used first is removed from the charging station, replaced with the replacement battery in the household appliance, and the replacement battery is connected to the charging station again for charging. Since the battery that was used first is usually only partially charged at this point, the battery replacement procedure described above is repeated at shorter and shorter intervals until, finally, both batteries are almost empty and the use process must be stopped until at least one of the batteries is fully charged again.

Currently, this problem is solved, for example, by providing an emergency connection for a power cable on the household appliance. By this means, however, the advantages of battery operation are lost that no disturbing cable or nearby socket is needed. Another solution is to provide a larger number of spare batteries and charging stations for these spare batteries. On the one hand, this increases costs and on the other hand, many of these replacement batteries are mostly kept in a fully charged condition, which reduces the lifetime of the batteries. If the last and rarely used replacement battery comes to use used in a particularly long use operation, its battery life is often very short.

Due to the problems described above, charging stations are increasingly being used, which enable so-called quick charging to minimize the charging time of a battery. However, such accelerated charging compared to a normal charging speed can lead to damage to the battery and to a shorter battery life.

The aforementioned features known from the prior art may be combined individually or in any combination with one of the objects and embodiments according to the disclosed embodiment(s) described below.

SUMMARY

A system with a household appliance, a charging station, and a plurality of battery units (rechargeable battery units) is used to solve problems described above. The system comprises a control configured so that a battery unit connected to the charging station can be charged in dependence on a discharge of a battery unit which is connected to the household appliance for operating the household appliance to perform a use operation.

By incorporation of principles disclosed in this paper, a battery unit may be charged in an accelerated manner only if this is necessary for a continuous use of the household appliance. It is therefore possible to typically charge a battery unit normally or even slowly and thus particularly gently. Advantageously, accelerated charging is therefore only performed if a battery unit that is not fully charged is in the charging station and the household appliance is being operated at the same time, i.e. power is being consumed. Overall, a long battery life can be achieved and at the same time a use of a purely battery-operated household appliance can be ensured as continuously as possible.

The operational readiness of the battery-operated household appliance can be thus increased and a virtually infinite period of use of the household appliance is made possible for carrying out a use operation with the battery units.

A virtually infinite period of use means a basically unlimited, continuous operation of the household appliance by the battery units without unwanted charging breaks, but only with short interruptions for replacing the battery units. It is enabled to perform very long use operations with only two battery units, or at least with a significantly reduced number of battery units, without an interfering interruption for battery recharging, and at the same time to achieve the longest possible service life of the battery units, which must be replaced when the end of the service life is reached.

A household appliance may thus dispense with a device for connection to an external power supply. In particular, the system can comprise exactly two or three battery units. Preferably, the household appliance is set up in such a way that the household appliance can be supplied with electrical energy for operating the household appliance exclusively by a battery unit. Optionally, a connection to an external power supply can be provided to charge a battery unit connected to the household appliance. In one configuration, a base station is provided for the household appliance. A battery unit connected to the household appliance can then be charged by connecting the household appliance to the base station. The base station is connected to an external power supply. In one configuration, the base station comprises a base station control.

Another aspect of the present disclosure relates to a household appliance, in particular for the system described above. The household appliance comprises a user-replaceable battery unit for operating the household appliance and a household appliance control for controlling the household appliance. The household appliance is adapted such that a discharge of the battery unit can be determined by the household appliance control and/or a battery unit control of the battery unit and/or transmitted to a charging station or a control during performance of a use operation. By determining the discharge, i.e. the discharging capacity, an input variable for charging a battery unit in a charging station is obtained, which enables a virtually infinite period of use. By the transmitting, a particularly simple system can be created to achieve a virtually infinite period of use. The transmission can take place immediately after the determining in real time or, by means of an intermediate storage, after completion of the use operation. The contents of the description of the system for solving the problem described at the beginning, including definitions, features and embodiments, shall also be applied to this aspect of the disclosed teaching.

A further aspect of the present disclosure relates to a charging station, in particular for the system described above, for charging a battery unit for a household appliance, i.e. one which is adapted for connecting and operating a household appliance. The charging station is adapted such that the charging station can receive an input variable, in particular a discharge, i.e. a discharging capacity, of a battery unit of a household appliance, and can charge a battery unit connected to the charging station in dependence on the input variable. The contents of the description of the system for solving the problem described at the beginning, including definitions, features and embodiments, shall also be applied to this aspect of the presently disclosed teachings.

In the following, exemplary implementations of the teachings in the present disclosure are also explained in more detail using figures. Features of the examples may be combined individually or in a plurality with the claimed objects, unless otherwise indicated. The scopes of protection claimed are not limited to the exemplary implementations.

DETAILED DESCRIPTION

Figure 1:
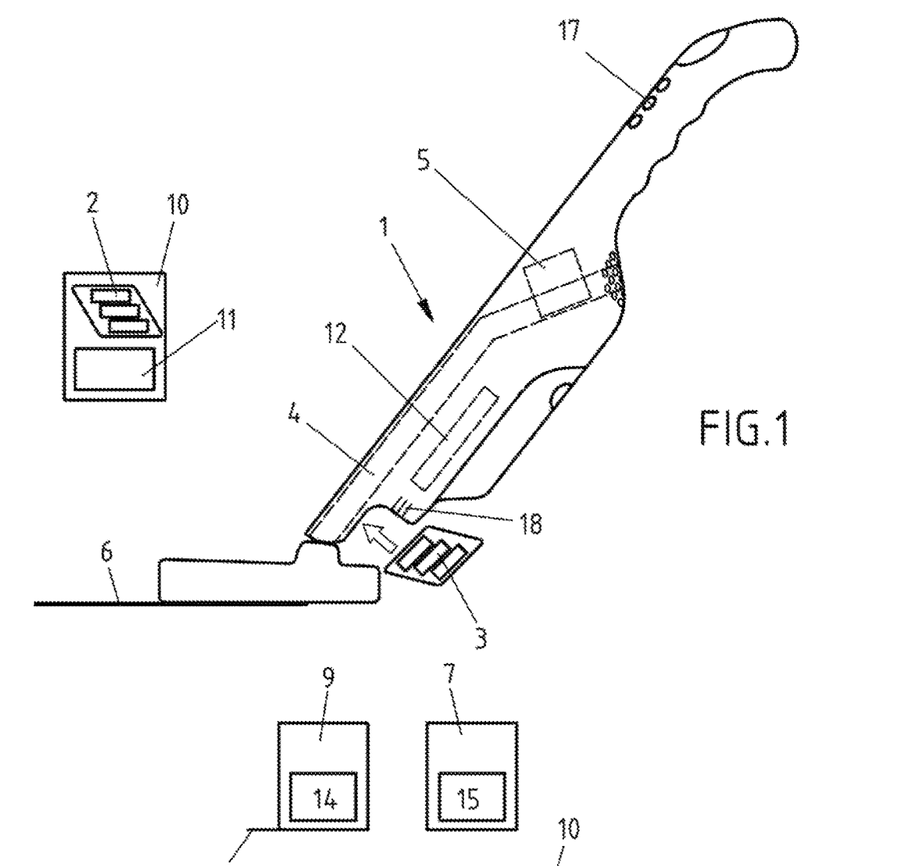
FIG. 1: Schematic representation of a charging station and a household appliance.

FIG. 1 shows an example of a vacuum cleaner as household appliance 1, which can be operated with battery units 2, 3. A battery unit 3 can be connected by the user to a connector 18 of the household appliance 1 and replaced manually. To clean a surface 6, dirt can be sucked in from the surface 6 via a changeable front-mounted implement using a suction channel 4 by means of a blower 5 on the household appliance 1. While the household appliance 1 is in operation, a battery unit 2, i.e. a replacement battery unit, can be charged by a remote charging station 10. The charging station 10 has a charging station control 11 and is connected to an external power supply via an electrical outlet. The charging station 10 is therefore generally to be operated as a stationary unit, while the household appliance 1 can be operated as a mobile unit independent of an external power supply. After completion of the performance of a use operation (here: cleaning the surface 6), the household appliance 1 can be connected to an optional base station 9 with a base station control 14, which can charge the battery unit 3 of the household appliance 1 via power lines of the household appliance 1. An external computer unit 7 with a computer control 15 is optionally provided to provide a user interface to the user and/or to control the charging of the battery units 2, 3. The household appliance 1 is equipped with a household appliance control 12.

Figure 2:
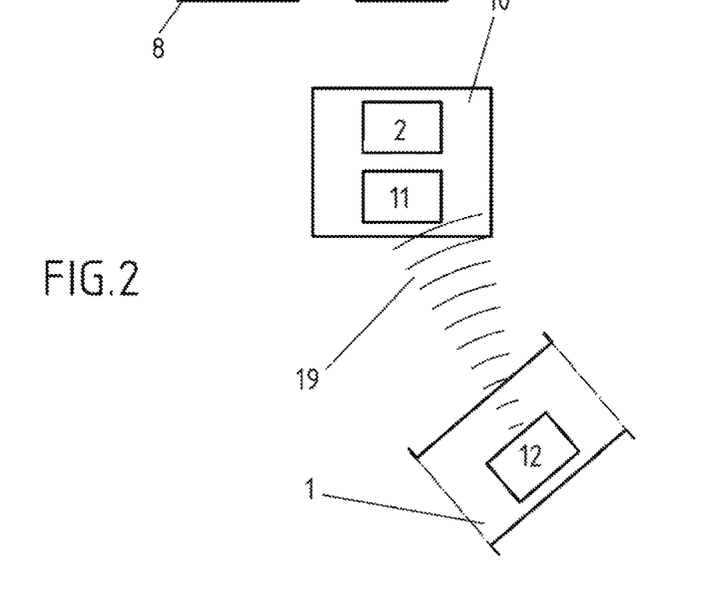
FIG. 2: Schematic representation of a wireless transmission.

FIG. 2 shows an exemplary implementation which, in addition to the exemplary implementation of FIG. 1, illustrates a wireless connection 19 for the exchange of data between the charging station control 11 and the household appliance control 12. The current discharge of the battery unit 3 is transmitted preferably in real time from the household appliance 1 to the charging station 10. In one configuration, the battery unit control 13 (see FIG. 3), base station control 14 and/or computer control 15 are adapted for wireless data exchange. The data determined by several appliances can be linked together in this way, for example to select a particularly suitable battery unit 2 from several battery units 2, 3 for charging and/or to indicate a particularly suitable battery unit 2 to the user for replacing an empty battery unit.

Figure 3:
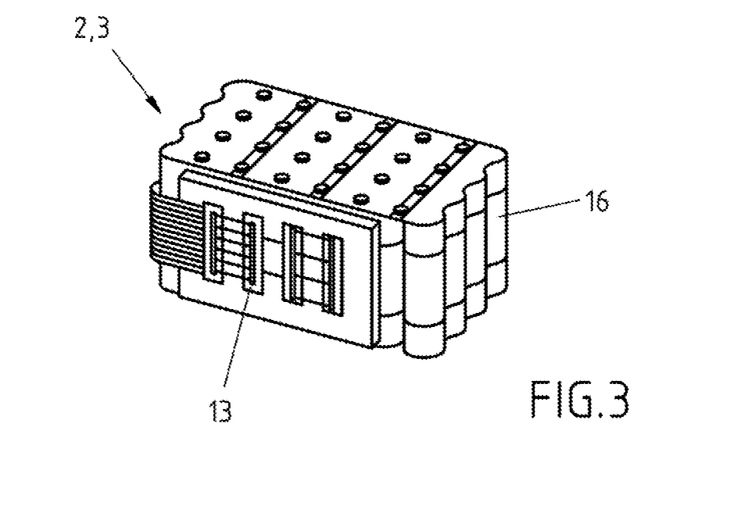
FIG. 3: Schematic representation of a battery unit.

FIG. 3 shows a battery unit 2, 3, which is equipped with at least one battery 16 and a battery unit control 13. In one configuration it is provided that charging is stopped when the battery unit 2 of the charging station 10 is fully charged and/or when the charge limit for replacing the battery unit 3 of the household appliance 1 is reached. When charging has been stopped, this will be indicated or acoustically signalled to the user via the battery unit 2, 3 of the household appliance 1 or the charging station 10, via the charging station 10, the base station 9, the household appliance 1, or via the external computer unit 7, preferably with an instruction or recommendation to the user to replace the battery unit 2.

Figure 4:
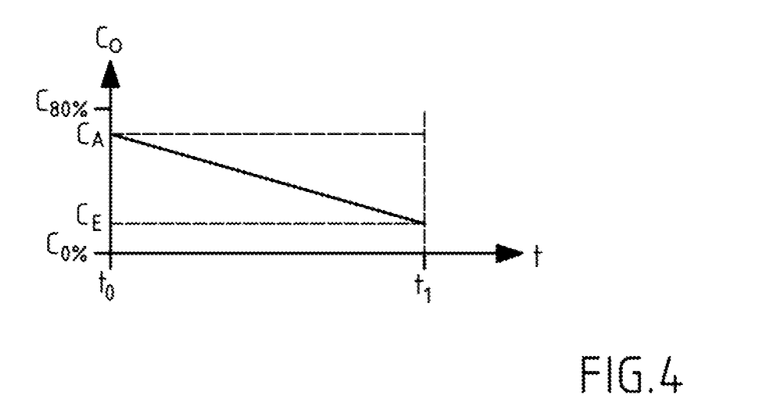
FIG. 4: Schematic representation of a charging and discharging process.

FIG. 4 shows a schematic, simplified example of a discharge curve of battery unit 3 of the household appliance 1 and a corresponding charge curve for battery unit 2 of the charging station 10. As the comparison of the curves of the two battery units 2, 3 in FIG. 4 shows, the change in the state of charge is opposite to each other. The same applies to the curves of the discharging capacity and charging capacity, which are not shown. For simplification, the curves are shown in linear form. In reality, the discharging capacity and thus the change in the state of charge of the battery unit 3 varies over time t during the use of the household appliance 1, sometimes considerably. In the case of a vacuum cleaner, the discharging capacity increases, for example, at the transition from a smooth floor to a carpet and when switching to a higher power level. Accordingly, the state of charge $C_O$ of the battery unit 3 would then drop more steeply. Both curves are plotted over the time t for a discharge-charge cycle. As FIG. 4, above, shows, the state of charge $C_O$ of the battery unit 3 of the household appliance 1 drops from a state of charge $C_A$, which was preferably set as the upper charge limit for the previous charging period of the battery unit 3, to a state of charge $C_E$ in the discharge period $t_0$ to $t_1$ as a result of the supply of electrical energy to the household appliance 1 for the use operation. An upper charge limit is preferably equal to or less than a state of charge $C_{80\%}$ of 80%. State of charge $C_E$ is preferably a fixed lower discharge limit that is greater than a state of charge $C_{0\%}$ of 0%. The charging period $t_0$ to $t_1$ is preferably the same length as the discharge period of the same discharge-charge cycle and/or at the same time. During the charging period of the shown discharge-charge cycle the state of charge $C_I$ of the battery unit 2 of the charging station 10 rises as the state of charge $C_O$ of the battery unit 3 falls. For this purpose, the battery unit 2 is charged with a charging capacity equal to the discharging capacity of the battery unit 3 plus loss compensation. If the current discharging capacity is very high and a normal charging speed is not sufficient to reach the required charging capacity according to the current discharging capacity plus loss compensation, it is possible to temporarily accelerate charging so that at time $t_2$ the charging state $C_A$ is always reached to which charging state $C_A$ the then discharged battery unit 3 was previously charged. If the current discharging capacity is correspondingly low or if battery unit 2 was connected to charging station 10 in a partially charged state, charging can be performed at a slow charging speed.

In one embodiment, the battery unit control 13 is a battery management system, also abbreviated BMS. This enables reliable measurement of the current state of charge of a battery unit, of the current charging capacity of the battery unit, of the ambient temperature and/or of a battery temperature. The BMS is preferably integrated in the battery unit. In one configuration, a battery unit 2, 3 has an additional memory, e.g. flash memory, and/or an (additional) power measuring device in addition to a BMS.

In one embodiment, a current, a voltage and/or an internal resistance are measured or determined for measuring the discharging capacity for the description and/or characterisation of the state of charge or the charging and discharging process. The use of electromagnetic or electrostatic variables will also be used in one configuration to determine the state of charge, e.g. magnetic flux, electromagnetic force, Coulomb force, Lorentz force, electromagnetic flux density.

In one embodiment it is provided that within a protective electronic unit of the battery unit control 13, the current voltage, i.e. the voltage curve, as well as the current amperage (current), i.e. the amperage (current) curve, are always recorded. A performance determination of the discharging capacity can thus take place over time using the battery unit control 13. Preferably, a comparison of the discharging capacity (history over time), of the average discharging capacity or amount of energy withdrawn of the last use operation, of the resistance or the change in state of charge with past discharge profiles of past use operations is carried out. A statistical evaluation and an optimized charge control can thus be enabled based on an estimate of the expected discharging capacity (history over time), average discharging capacity or amount of energy required for the next cycle. Thus, the probably required discharging capacity (history over time), average discharging capacity or required amount of energy can be determined and used for controlling the charging process.

In one configuration it is provided that a user can activate and deactivate the function described above for charging a battery unit 2 depending on the discharge of an inserted battery unit 3 as required, e.g. via app or by a choice, e.g. switch, on the household appliance or a base station 9. Whether this configuration is active can then be indicated to the user on the household appliance, on the battery unit 2, 3, on the base station 9 or the computer unit 7 via display, e.g. via LED 17, or in an app.

A household appliance is, for example, a cleaning appliance for the household, a food preparation appliance for the household, a sewing device for the household or a tool for the home handyman such as a cordless screwdriver for the household. A use operation is, for example, the cleaning of a dwelling or the floor of a dwelling, an automatic or semi-automatic preparation of a meal or drink, or a household repair or construction operation. A use operation is a continuous process. A use operation may be interrupted by a break which, however, is not caused by discharged batteries.

A charging station is a device separate from the household appliance for charging a battery unit connected to the charging station. The charging station is connected to an external power supply. An external power supply provides electrical energy e.g. via a socket which can be conducted via a power cable. In one configuration the charging station comprises a charging station control.

A battery unit can be a single battery or a battery pack with several batteries. A battery unit for operating the household appliance can supply the household appliance with electrical power. In one configuration, the battery unit comprises a battery unit control, in particular a so-called battery management system (BMS). A battery unit connected to the household appliance or the charging station can also be referred to as a battery unit of the household appliance or battery unit of the charging station. A battery life is the maximum possible period of time during which a battery unit connected to the household appliance can supply the household appliance with electrical energy, whereby a constant reference power of the household appliance is used as a basis for comparison of battery lives. A discharged, empty or depleted battery unit is present when a defined lower discharge limit is reached. A fully charged battery unit is present when the charge state corresponds to a defined upper charge limit. Both the lower discharge limit and the upper charge limit are generally not the outermost technically available lower and upper limits, but correspond to the manufacturer's specifications for the protection of the battery unit or are in one configuration set by the control between the upper limit and lower limit according to the manufacturer's specifications. In particular, the battery units are identical in construction. Preferably, the system comprises exactly two or exactly three battery units. In principle, one or more additional battery units can be provided, for example for use operations or household appliances with particularly high power requirements. The service life of a battery unit refers to the maximum available capacity or the number of charge and discharge cycles from the state of delivery of the battery until the end of its service life. The end of the service life is reached, for example, when there is only a technically maximum available capacity of 80% left compared to the state of delivery or when a predefined number of, for example, a thousand charge/discharge cycles has been reached. A measure of the maximum available capacity can be determined by charging the battery to the maximum—without a limiting influence of a control—and switching on the household appliance and measuring the time until the household appliance stops operating due to discharge of the battery unit. As a battery unit ages, the maximum available capacity (hereinafter referred to as "charging capacity") decreases as a result of ageing. The state of charge indicates the percentage of the maximum available capacity that is currently charged and therefore available.

The discharge is a variable that can be specified with a numerical value. A charge in dependence on a discharge of a battery unit means that the control comprises an algorithm that converts an input variable indicating the discharge into an output variable used to control the charging process.

In one embodiment, the control is configured so that the battery unit of the charging station connected to the charging station can be charged to a charging amount corresponding to the discharge of the battery unit of the household appliance which is connected to the household appliance for operating the household appliance to perform a use operation. This means that after a replacement of the battery units, the battery unit charged to this charging amount can be discharged to the same extent as the replaced battery unit. In particular, the charging amount can include a loss compensation. The discharge is an absolute value greater than zero. The two battery units behave in opposite ways, e.g. in relation to the electrical power or the change in the state of charge.

A loss compensation is a value greater than zero to compensate for energy losses that may occur. If the battery unit of the household appliance is discharged by a certain energy, in return the battery unit of the charging station is charged by the same certain energy and finally the battery unit of the household appliance is replaced by the battery unit of the charging station, a difference may occur due to energy losses over this entire process. If, for example, a battery unit of a vacuum cleaner as the household appliance is discharged by the use operation with e.g. 400W and the battery unit of the charging station is also charged with 400 W, a total power loss of e.g. 100 W can occur after the battery units have been replaced. By providing for loss compensation, in the given example amounting to 100 W, a temporally unlimited period of use can be made possible with particular reliability. In particular, loss compensation is a compensation of power loss. In one configuration, the loss compensation is stored in the control as a fixed parameter, preferably as a proportion of the discharge, and/or is determined on the basis of measurements during current or past use operations preferably by the control. In one configuration, the loss compensation is determined e.g. depending on the current charging capacity, the current internal resistance, the current state of charge and/or the type of battery unit of the household appliance and/or charging station or is selected accordingly from stored parameter values, e.g. via lookup table. Optionally, the ambient temperature and/or a household appliance setting such as e.g. the current power level of a vacuum cleaner can be taken into account when determining the temperature loss or loss compensation.

In one embodiment, the control is configured so that the battery unit of the charging station can be charged in a charging amount that corresponds to the discharge of the battery unit during the performance of the use operation or that is equal to the discharge of the battery unit during the performance of the use operation plus a loss compensation until the battery unit of the household appliance is discharged. The charging amount is therefore a required charging amount depending on the discharge and possibly a loss. If the battery unit of the charging station is already almost fully charged, the charging will accordingly be slow, and if the battery unit is discharged, the charging will accordingly be fast. This can extend the service life of the battery units. After the battery unit of the charging station has replaced the discharged battery unit of the household appliance, the user can continue to perform the use operation with a battery life similar to that of the previously replaced battery unit. Advantageously, a user can evaluate the battery life. In one configuration, the charging period of the (replacement) battery unit is equal to the discharge period of the battery unit to be replaced.

In one embodiment, the charging station can charge at two different charging speeds, preferably at three or four different charging speeds. In particular, charging can be slow, normal or accelerated. Accelerated charging means charging at a very or excessively high charging speed which is higher than normal. Accelerated charging in one configuration is charging that is referred to by the technical term "fast charging". In one configuration, charging at normal charging speed refers to a standard charging speed, i.e. not "fast charging". This makes it possible to adapt the charging speed of the battery unit of the charging station to the discharging speed of the battery unit of the household appliance being in operation at the same time, preferably taking into account a loss compensation. Furthermore, charging can otherwise be performed at a slower charging speed, i.e. at a lower speed than the normal charging speed. This avoids the need to provide additional battery units which would otherwise have been necessary. For technical reasons, deviations of up to ten percent, for example, can occur at a theoretically identical speed. The different charging speeds can be defined differently depending on the battery unit and/or the battery type.

In one configuration, the system is configured in such a way that in case of different charging capacities with otherwise identical battery units, only the battery unit with the greater charging capacity—which is therefore usually less aged—is charged at maximum possible speed or in an accelerated manner. Since accelerated charging leads to a disproportionately greater reduction in the further service life of more aged battery units than of less aged battery units, this can achieve a uniform service life of the battery units used. This avoids the situation that only one battery unit is available or that the acquisition of a new battery unit leads to the household appliance having to be operated with differently functioning batteries.

In one embodiment, the charging station and the battery unit are adapted in such a way that accelerated charging can be performed, such that the battery unit of the charging station can be charged with the required charging amount continuously or at least virtually continuously. It is then possible to charge at a charging speed that is just sufficient to reach the required charging amount while charging the battery unit of the charging station. The life of the battery units can thus be extended especially effectively.

The required charging amount is an absolute value in the amount of the discharge, in particular plus loss compensation. This avoids unnecessary charging at the maximum possible charging speed.

In one embodiment, discharge is determined by determining the electrical power consumed by the household appliance, i.e., the discharging capacity of the battery unit of the household appliance. The discharge can thus be determined very easily. The electrical power or discharging capacity is the product of the current and voltage supplied to the household appliance by a battery unit to perform a use operation. In one configuration the discharging capacity is measured or determined by the household appliance control or the battery unit control. Alternatively or additionally, the discharge can be determined on the basis of or in consideration of a measured current, a measured voltage, a total amount of energy withdrawn, an internal resistance and/or a state of charge of the battery unit of the household appliance. Measurement and/or determination of the discharge is preferably performed by the household appliance control or the battery unit control. In particular, the state of charge can be determined by measuring the internal resistance of the battery unit.

In one embodiment the discharge is a current discharge, i.e. a current value during the operation of the household appliance. According to this embodiment, a battery unit connected to the charging station can therefore be charged during operation of the household appliance in dependence on a current discharge of a battery unit which is connected to the household appliance for operating the household appliance to perform a use operation. In this embodiment it is measured continuously or at intervals of time during the use of the battery unit in the household appliance how much electrical power is consumed per unit of time and/or per time interval in order to charge in dependence on this measured value. This embodiment enables the battery unit in the charging station or several battery units in one or more charging stations to be charged especially precisely in such a way that an empty battery unit of the household appliance can be replaced without delay by a battery unit of the charging station that is sufficiently charged to achieve a virtually infinite total duration of use. Since the charging process in the charging station takes into account the current energy consumption of the household appliance in the form of the current discharge, the household appliance can be used particularly reliably for an unlimited period of time.

In one embodiment, the control controls the charging of the battery unit of the charging station in such a way that a current charging capacity (current charging power) of the battery unit of the charging station corresponds to the current discharging capacity (current discharging power) of the battery unit of the household appliance in operation or is equal to the current discharging capacity of the battery unit of the household appliance in operation plus compensation for power loss. In this way, a continuous operational readiness of the household appliance can be achieved particularly reliably.

In one embodiment, the household appliance, preferably a household appliance control, or the battery unit of the household appliance, preferably a battery unit control, determines and/or measures the discharging capacity and transmits the determined discharging capacity to the charging station so that the battery unit of the charging station can be charged in dependence on the current discharging capacity. The current charging capacity can thus be adapted to the current discharging capacity in near real time. This type of synchronization allows a continuous operational readiness to be achieved with particular reliability.

In one configuration it is provided that the charging station has a charging station control, the household appliance has a household appliance control and/or the battery unit has a battery unit control. This enables a particularly efficient data acquisition and synergetic data linking, in order to enable a virtually infinite period of use in a particularly reliable way. In addition, a base station can be provided in one configuration for charging the battery unit of a household appliance connected to the base station. In particular, the base station is equipped with a base station control. In a further development, an external computer unit or an interface for this is comprised by the system. In particular, the external computer unit has a computer control. Preferably the external computer unit is a smartphone or server, preferably with an app or cloud application.

In one configuration control is performed by the charging station control, the household appliance control, the battery unit control, the base station control and/or the computer control. In one configuration, the device used for controlling comprises a wired and/or wireless communication interface.

In one embodiment the discharge is a predicted discharge, i.e. a predicted value. A battery unit connected to the charging station can thus be charged in dependence on a predicted discharge of a battery unit which is connected to the household appliance for operating the household appliance to perform a use operation. This embodiment makes it possible to achieve a virtually infinite period of use with a particularly simple system with a minimum of technical effort.

In one embodiment, the predicted discharge is determined based on measuring or determining the discharge of at least one use operation performed in the past. This avoids the time-consuming real-time recording and transmission of the current discharge. A use operation performed in the past is a completed process such as the completion of the floor cleaning of a dwelling, i.e. without overlapping with a subsequent or current use operation.

In one configuration the discharge during a use operation performed in the past is measured or determined by the household appliance or the battery unit. In one embodiment, the household appliance and/or the battery unit stores data about the discharge, preferably a discharge history over time. In one configuration, the household appliance, in particular the household appliance control with the stored data, transmits the data to the battery unit, preferably by wire. Alternatively, it can be provided that the household appliance transmits the data to a base station when the household appliance is connected to the base station. The base station then preferably forwards the data to the charging station, preferably by wire. In one configuration, the battery unit transmits the stored data on discharge to the charging station, preferably by wire, when the battery unit is connected to the charging station.

In one embodiment, the predicted discharge corresponds to the average discharge of at least one use operation performed in the past. A comparatively simple calculation method that requires very little computing capacity can therefore be sufficient to provide a value of the predicted discharge, i.e. the discharging capacity, that is sufficiently usable for the charging operation. For example, pauses during a use operation also lead to a reduction in the average discharging capacity and thus to the possibility to reduce the charging capacity. In one configuration, the average discharge is the average discharging capacity that was measured or determined during one or more use operations. In one configuration, the average discharge is the average amount of energy withdrawn per use operation with known duration of the use operation, i.e. the total amount of energy withdrawn during a use operation with known duration of the use operation. It is preferable to average over several use operations of the past. From the amount of energy withdrawn, an average discharge for a defined use operation or an average discharging capacity can be determined. In one configuration, an average discharge is determined for different, defined use operations, e.g. floor cleaning of the dwelling or wall vacuuming of the dwelling's walls. In particular, the use operation can be assigned automatically by the household appliance setting.

In one embodiment, the discharging capacity is determined on the basis of a current discharging capacity and a predicted discharging capacity. A particularly reliable function can thus be obtained.

In one embodiment, for exactly one battery unit of the household appliance or one battery unit of the household appliance, respectively, only one battery unit of the charging station is provided to replace the one battery unit of the household appliance. Additional replacement battery units are avoided. In one embodiment, for exactly one battery unit of the household appliance or one battery unit of the household appliance, respectively, at least two battery units are provided to replace the one battery unit of the household appliance. In this way, a distribution of the required charging amount among the at least two battery units can be realized. This makes it possible to avoid or reduce accelerated charging. In one embodiment only one battery unit of the at least two battery units is connected to the charging station. This allows the use of a simple charging station. In one embodiment, the at least two battery units or all of the at least two battery units are connected to one charging station each or to only one charging station. This enables the evaluation of the states of the individual battery units connected to a charging station.

In one embodiment, the control is configured in such a way that the discharge of the battery unit of the household appliance can be divided among several battery units in such a way that the several battery units are charged in sum to the charging amount corresponding to the discharge of the battery unit of the household appliance or is equal to the discharge of the battery unit of the household appliance plus loss compensation. Once the battery unit of the household appliance has been discharged, it can then be replaced by at least one of these several battery units. The respective states of the individual battery units during the charging process and during selection for use in the household appliance can thus be taken into account. In particular, the charging station, the household appliance or the control receives or determines system basic information, system status information, battery unit basic information of a battery unit and/or battery unit status information of a battery unit. Preferably, controlling of the charging of the battery unit of the charging station and/or a selection of a battery unit to be charged to replace a battery unit of the household appliance in operation is performed depending on at least one of the four kinds of information mentioned. In particular, the system basic information, system status information, battery unit basic information and/or battery unit status information can be stored in a battery unit memory.

The battery unit basic information comprises the charging capacity from the delivery of the battery unit from the manufacturer, the maximum charging current, the maximum charging voltage from the delivery from the manufacturer and/or the type of battery unit, i.e. the battery material used in the battery unit such as nickel-cadmium (NiCd), nickel-metal hydride (NiMH), lithium-ion (Li-Ion) or lithium-ion polymer (Li-Ion-Poly). The battery unit status information comprises the current charge state of the battery unit, the current charging capacity, the current charge current, the current charge voltage and/or the current internal resistance of the battery unit. In one configuration the ambient temperature is measured. The charging capacity can then be determined in relation to the ambient temperature in order to be particularly precise, because the charging capacity decreases with falling temperature. The system basic information comprises the total number of all battery units comprised by the system and/or the number of connections for battery units of the household appliance and/or of the at least one charging station. The system status information comprises the total state of charge of all battery units, i.e. the total amount of energy currently stored in all battery units of the system, including the battery unit in use and the battery units not connected to a household appliance.

In one configuration, the discharge is divided among two battery units simultaneously, i.e. two battery units are charged simultaneously while the battery unit of the household appliance is being discharged, which is to be replaced by the two battery units after it has been discharged. A battery unit in operation is therefore replaced by two battery units according to this configuration. For example, a battery unit with a large charging capacity can be replaced by two replacement battery units, each with an age-related low charging capacity. In one configuration, the household appliance has an additional connection point so that for a battery unit of the household appliance that was removed for replacement, one or two battery units can be connected to the household appliance, respectively, in the place of the removed battery unit. After one battery unit has been replaced by two battery units, two battery units connected to the household appliance are preferably replaced by only one battery unit, so that one connection point remains free again.

In one configuration, the discharge is divided among two battery units in a temporally successive manner. If, for example, one battery unit of the household appliance has a large charging capacity and one of the several battery units has a low charging capacity, the battery unit of the household appliance can first be replaced by the fully charged battery unit with a low charging capacity and the difference between the different charging capacities can be added to the next battery unit to be charged with a larger charging capacity.

In one configuration an upper charge limit and/or a lower discharge limit is set and/or stored by the control, preferably for each discharge-charge cycle and/or for each battery unit. In this way the service life of the battery unit is increased. In addition, a temporally successive distribution of the discharge to several battery units can be simplified. In one configuration, the upper charge limit and/or the lower discharge limit are set as a function of a determined loss and/or loss compensation, as a function of the current state of charge, as a function of the current charging capacity and/or as a function of the ambient temperature. The consideration of the current state of charge enables the service life of a battery unit to be increased, e.g. by charging an already almost fully charged battery unit slower and an empty battery unit faster. The consideration of the current charging capacity enables the upper charge limit and/or lower discharge limit to be set accordingly to compensate for age-related differences in the charging capacity of the battery unit, e.g. by raising the lower discharge limit in one configuration for a battery unit with a lower current charging capacity. Taking the ambient temperature into account can be used to correct the current charging capacity and/or to compensate for losses. At a higher temperature, for example, the losses can decrease and thus a higher amount of energy can be withdrawn. In one embodiment, a more aged battery unit is charged more gently than a younger or less aged battery unit. In particular, as an alternative or in addition to the upper charge limit or lower discharge limit, the charging current or charging voltage can be adjusted. In this way the ageing of the battery units can be controlled and the service life of the battery units increased.

In one embodiment, the user is asked to replace the inserted battery unit with the battery unit in the charging station when the battery unit in the charging station has reached an upper charge limit, i.e. is fully charged. In this way a life shortening conservation of the fully charged battery unit in the charging station can be avoided.

The invention claimed is:
1. A system comprising:
a household appliance;
a charging station;
a plurality of battery units, wherein a first battery unit of the plurality of battery units is connected to the charging station and a second battery unit of the plurality of battery units is connected to the household appliance to operate the household appliance; and
a control unit configured to charge the first battery unit based on an input variable associated with an amount of power discharge of the second battery unit,
wherein the control unit is configured to charge the first battery unit to a power level equal to a sum of a predefined power loss value and the amount of power discharge of the second battery unit during operation until the second battery unit is discharged,
wherein the predefined power loss value is a value greater than zero to compensate for energy losses that occur when the battery unit of the household appliance is discharged by a certain energy, in return the battery unit of the charging station is charged by the same certain energy and finally the battery unit of the household appliance is replaced by the battery unit of the charging station,
wherein the predefined power loss value is stored in or determined by the control unit, wherein the charging station and the household appliance have corresponding communication interfaces which are set up to transmit the current discharge of the battery unit of the household appliance from the household appliance to the charging station.

2. The system of claim 1, wherein the amount of power discharge of the second battery unit is a predicted amount of power discharge.

3. The system of claim 2, wherein the control unit is configured determine the predicted amount of power discharge based on a previously measured amount of power discharge of the second battery unit.

4. The system of claim 3, wherein the determined predicted amount of power discharge corresponds to an average amount of power discharge of the second battery unit during at least one previous operating cycle.

5. The system according to claim 1, wherein the control unit is configured to charge the first battery unit at one of at least two different charging speeds.

6. The system according to claim 1, wherein the control unit is configured to charge the first battery unit such that an amount of power charge of the first battery unit is equal to the sum of the amount of power discharge of the second battery unit during operation and the predefined power loss value.

7. The system of claim 6, wherein at least one of the household appliance and the second battery unit is configured to determine the amount of power discharge of the second battery unit and transmit a signal to the charging station indicating the determined amount of power discharge of the second battery unit, and wherein the charging station charges the first battery unit based on the determined amount of power discharge.

8. The system of claim 1, wherein the plurality of battery units is exactly one second battery unit and exactly one first battery unit.

9. The system according to claim 1, wherein the control unit is configured to divide the amount of power discharge of the second battery unit among several battery units of the plurality of battery units, and wherein the charging unit is configured to charge the several battery units such that a sum of respective amount of power charge of each of the several battery units corresponds to the amount of power discharge of the second battery unit.

10. The system according to claim 1, wherein the control unit is configured to store at least one of an upper charge limit (CA) and a lower discharge limit (CE).

11. The system according to claim 10, wherein the control unit is configured to request the user to replace the second battery unit with the first battery unit in the charging station in response to determining that the amount of power charge of the first battery unit corresponds to the upper charge limit (CA) of the first battery unit.

12. The system of claim 1, wherein the control unit is configured to determine the predefined power loss value based on measured operating parameter values during one of a present operating cycle and a previous operating cycle.

13. A household appliance comprising:
a first user-replaceable battery unit electrically coupled to power the household appliance; and
a household appliance control unit for controlling the household appliance, wherein the household appliance unit is configured to
determine, during operation of the household appliance, a value of an input variable corresponding to an amount of power discharged by the first user-replaceable battery unit, and
transmit, to a charging station communicatively coupled to the household appliance control unit, a signal indicating the value of the input variable to charge a second user-replaceable battery unit electrically coupled to the charging station to a power level equal to a sum of a predefined power loss value and the amount of power discharge of the second user-replaceable battery unit,
wherein the predefined power loss value is determined by the household appliance,
wherein the predefined power loss value is a value greater than zero to compensate for energy losses that occur, when the battery unit of the household appliance is discharged by a certain energy, in return the battery unit of the charging station is charged by the same certain energy and finally the battery unit of the household appliance is replaced by the battery unit of the charging station.

14. The household appliance of claim 13, wherein the household appliance control unit is configured to determine the predefined power loss value is based on at least one of a current charging capacity, a current internal resistance, a current state of charge, and a type of at least one of the plurality of battery units of the household appliance and/or the charging station.

15. A charging station for charging a first battery unit connected to the charging station, the first battery unit being configured to power a household appliance, the charging station being configured to:
receive a signal, from the household appliance during operation of the household appliance, indicating a value of an input variable corresponding to an amount of power discharged by a second battery unit to power the household appliance, and
charge the first battery unit based on the value of the input variable to a power level equal to a sum of a predefined power loss value and the amount of power discharge of the second battery unit during operation of the household appliance,
wherein the predefined power loss value is stored in the charging station,
wherein the predefined power loss value is a value greater than zero to compensate for energy losses that occur, when the battery unit of the household appliance is discharged by a certain energy, in return the battery unit of the charging station is charged by the same certain energy and finally the battery unit of the household appliance is replaced by the battery unit of the charging station.

16. The charging station of claim 15, wherein the control unit is configured to select the predefined power loss value from among parameter values stored in a lookup table of the control unit.

17. A system comprising
a household appliance,
a charging station,
a plurality of battery units, and
a control unit configured so that a first battery unit of the plurality of battery units connected to the charging station is charged based on an input variable associated with a discharge of a second battery unit connected to the household appliance for operating the household appliance, wherein the control unit is configured so that the charging of the first battery unit to a charging amount is completed before the second battery unit of the household appliance is discharged, the charging amount being equal to a sum of a predefined power loss value and an amount of power discharge of the second battery unit during operation of the household appliance, wherein the predefined power loss value is a value greater than zero to compensate for energy losses that occur, when the battery unit of the household appliance is discharged by a certain energy, in return the battery unit of the charging station is charged by the same certain energy and finally the battery unit of the household appliance is replaced by the battery unit of the charging station.

18. The system of claim 17, wherein the predefined power loss value is a fixed parameter representative of a proportion of a discharge capacity of at least one of the plurality of battery units.

* * * * *